(12) United States Patent
Dimitrakopoulos et al.

(10) Patent No.: US 8,852,342 B2
(45) Date of Patent: Oct. 7, 2014

(54) FORMATION OF A VICINAL SEMICONDUCTOR-CARBON ALLOY SURFACE AND A GRAPHENE LAYER THEREUPON

(75) Inventors: Christos D. Dimitrakopoulos, Baldwin Place, NY (US); Marcus O. Freitag, Sleepy Hollow, NY (US); Alfred Grill, White Plains, NY (US); Robert L. Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 499 days.

(21) Appl. No.: 12/870,967

(22) Filed: Aug. 30, 2010

(65) Prior Publication Data

US 2012/0049161 A1    Mar. 1, 2012

(51) Int. Cl.
  *H01L 29/04*       (2006.01)
  *H01L 21/71*       (2006.01)
  *H01L 21/02*       (2006.01)
  *H01L 29/66*       (2006.01)
  *H01L 27/12*       (2006.01)
  *H01L 29/786*      (2006.01)
  *H01L 29/16*       (2006.01)
  *H01L 29/778*      (2006.01)

(52) U.S. Cl.
  CPC ........ *H01L 29/045* (2013.01); *H01L 21/02631* (2013.01); *H01L 21/02527* (2013.01); *H01L 29/66742* (2013.01); *H01L 27/1266* (2013.01); *H01L 21/02381* (2013.01); *H01L 29/78684* (2013.01); *H01L 21/02532* (2013.01); *H01L 21/02664* (2013.01); *H01L 29/1606* (2013.01); *H01L 29/66068* (2013.01); *H01L 29/7781* (2013.01); *H01L 21/02378* (2013.01)

USPC ............ 117/101; 117/84; 117/106; 117/109; 257/29; 257/77; 257/E21.049; 438/478

(58) Field of Classification Search
  USPC .................................. 117/4, 7; 438/455, 456
  See application file for complete search history.

(56) References Cited

U.S. PATENT DOCUMENTS

| | | | |
|---|---|---|---|
| 4,833,100 A * | 5/1989 | Hanafusa et al. ............. | 117/106 |
| 6,127,243 A * | 10/2000 | Werner et al. ................. | 438/456 |
| 2010/0314626 A1* | 12/2010 | Harada et al. .................. | 257/77 |
| 2011/0223094 A1* | 9/2011 | Lanzara et al. ............ | 423/447.2 |

* cited by examiner

*Primary Examiner* — Colleen Matthews
*Assistant Examiner* — William Harriston
(74) *Attorney, Agent, or Firm* — Scully, Scott, Murphy & Presser, P.C.; Louis J. Percello, Esq.

(57) ABSTRACT

A surface of a single crystalline semiconductor-carbon alloy layer having a surface normal along or close to a major crystallographic direction is provided by mechanical means such as cutting and/or polishing. Such a surface has naturally formed irregular surface features. Small semiconductor islands are deposited on the surface of single crystalline semiconductor-carbon alloy layer. Another single crystalline semiconductor-carbon alloy structure may be placed on the small semiconductor islands, and the assembly of the two semiconductor-carbon alloy layers with the semiconductor islands therebetween is annealed. During the initial phase of the anneal, surface diffusion of the semiconductor material proceeds to form vicinal surfaces while graphitization is suppressed because the space between the two semiconductor-carbon alloy layers maintains a high vapor pressure of the semiconductor material. Once all semiconductor material is consumed, graphitization occurs in which graphene layers can be formed on the vicinal surfaces having atomic level surface flatness.

18 Claims, 9 Drawing Sheets

20 µm x 20 µm

10 μm × 10 μm

10 μm × 10 μm

5 μm × 5 μm 1.5 μm × 1.5 μm

40 μm x 40 μm

5 μm x 5 μm

20 μm x 20 μm

FORMATION OF A VICINAL SEMICONDUCTOR-CARBON ALLOY SURFACE AND A GRAPHENE LAYER THEREUPON

STATEMENT REGARDING FEDERALLY SPONSORED RESEARCH OR DEVELOPMENT

This disclosure was made with government support under Defense Advanced Research Project Agency (DARPA) CERA Contract No. FA8650-08-C-7838 awarded by the U.S. Department of Defense. The government has certain rights in this disclosure.

BACKGROUND

The present disclosure relates to a method of forming a vicinal semiconductor-carbon alloy crystalline surface.

Referring to FIG. 1, an annealed surface of a single crystalline silicon carbide substrate is shown. The surface of the single crystalline silicon carbide substrate is pitted because selective evaporation of silicon atoms during anneal at an elevated temperature of about 1,450° C. results in formation of pitted surfaces and graphitization on all exposed surfaces. The flat regions of the graphene layers formed on such surfaces do not laterally extend over a wide area due to the presence of the pits, and consequently, the graphene layer quality may not be as high as it could if it consisted of only flat regions. Since the graphene layers on the surface follow the contours of the pitted surface of the single crystalline silicon carbide substrate, the orientations of the graphene layers vary. The randomness of the orientations of the graphene layer on this type of surface combined with the surface topography makes it difficult to provide useful devices employing the fragmented graphene layers on this type of surface. Therefore, a contiguous sheet of a graphene layer having a clearly defined constant orientation over a large area would be desirable.

BRIEF SUMMARY

An embodiment of the present disclosure provides a method of forming a contiguous graphene layer having a constant orientation over a large area of an unpitted smooth surface of a single crystalline semiconductor-carbon alloy layer.

A surface of a single crystalline semiconductor-carbon alloy layer having a surface normal along or close to a major crystallographic direction is provided by mechanical means such as cutting and/or polishing. Such a surface has naturally formed irregular surface features. Small semiconductor islands are deposited on the surface of single crystalline semiconductor-carbon alloy layer, for example, by annealing the single crystalline semiconductor-carbon alloy layer in an environment in which the semiconductor material of the single crystalline semiconductor-carbon alloy layer is externally provided either as a gas or an influx of a beam. Another single crystalline semiconductor-carbon alloy wafer, or a layer of a single crystalline semiconductor-carbon alloy deposited on an appropriate support wafer, may be placed on the small semiconductor islands, and the assembly of the two semiconductor-carbon alloy layers with the semiconductor islands therebetween is annealed. During the initial phase of the anneal, surface diffusion of the semiconductor-carbon alloy material proceeds to form vicinal surfaces while graphitization is suppressed because the space between the two semiconductor-carbon alloy layers maintains a high vapor pressure of the semiconductor material. Once all the semiconductor material is consumed, graphitization occurs in which graphene layers can be formed on the vicinal surfaces having atomic level surface flatness.

According to an aspect of the present disclosure, a method of forming a vicinal surface on a single crystalline semiconductor-carbon alloy layer is provided. The method includes: forming semiconductor islands on a surface of a single crystalline semiconductor-carbon alloy layer; and annealing the single crystalline semiconductor-carbon alloy layer while a substrate is placed on the semiconductor islands, wherein the surface of the single crystalline semiconductor-carbon alloy layer becomes a vicinal surface during the annealing.

According to another aspect of the present disclosure, a method of forming a graphene layer is provided. The method includes: forming semiconductor islands on a surface of a single crystalline semiconductor-carbon alloy layer; annealing the single crystalline semiconductor-carbon alloy layer while a substrate is placed on the semiconductor islands, wherein the surface of the single crystalline semiconductor-carbon alloy layer becomes a vicinal surface during the annealing; and continuing the annealing after formation of the vicinal surface, wherein a graphene layer including at least one graphene monolayer is formed at the vicinal surface as semiconductor atoms evaporate from the vicinal surface.

According to yet another aspect of the present disclosure, a structure is provided, which includes: a single crystalline semiconductor-carbon alloy layer having a vicinal surface; and a graphene layer including at least one graphene monolayer and located at the vicinal surface.

DETAILED DESCRIPTION

Figure 1:
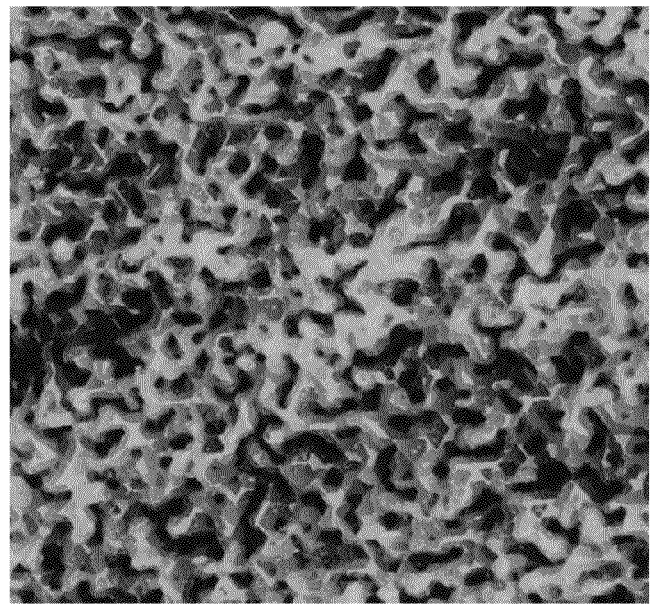
FIG. 1 is an atomic force microscopy (AFM) image of a 20 μm×20 μm area of a surface of a prior art single crystalline silicon carbide substrate that has been annealed at an elevated temperature about 1,450° C. in an argon ambient. A severe surface pitting occurred on the surface. While graphene layers are present on the surface, the graphene layers follow the contour of the underlying silicon carbide substrate.

As stated above, the present disclosure relates to a method of forming a graphene layer on a carbon-containing semiconductor layer, and a structure obtained by the same, which are now described in detail with accompanying figures. It is noted that like and corresponding elements are referred to by like reference numerals. The drawings are not in scale. In drawings including a coordinate system, the x-axis is along a horizontal direction within the plane of the drawing, the y-axis is along a direction perpendicular to the plane of the drawing, and the z-axis is along a vertical direction within the plane of the drawing.

As used herein, a "vicinal" surface is a surface of a single crystalline material of which the surface normal deviates slightly from a major crystallographic orientation.

A crystallographic orientation is considered to a "major" crystallographic orientation if all Miller indices are less than 7 in absolute value.

A surface normal is considered to deviate "slightly" from a major crystallographic orientation if the angle between the major crystallographic orientation and the surface normal is less than 2 degrees.

As used herein, an "atomic bilayer" refers to a set of at least one layer consisting of a layer of semiconductor atoms and a layer and a layer of carbon atoms that constitute the semiconductor-carbon alloy material of a single crystalline semiconductor-carbon alloy layer.

Figure 2:
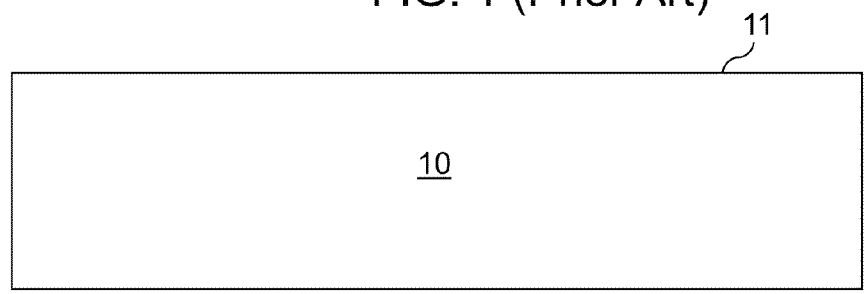
FIG. 2 is a schematic vertical cross-sectional view of an exemplary structure prior to deposition of semiconductor islands according to an embodiment of the present disclosure.

Referring to FIG. 2, an exemplary structure according to an embodiment of the present disclosure includes a single crystalline semiconductor-carbon alloy layer 10. The single crystalline semiconductor-carbon alloy layer 10 may constitute a stand-alone substrate, or may be located on a handle substrate (not shown) such that the substrate includes a stack of the single crystalline semiconductor-carbon alloy layer 10 and the handle substrate. If a handle substrate is present, the material of the handle substrate is selected such that the melting temperature of the material of the handle substrate is considerably greater than the temperature of an anneal to be subsequently employed, and its vapor pressure is negligible at the temperature of the anneal to avoid incorporation of its atoms into the substrate. For example, the handle substrate, if present, may be high purity graphite or a refractory metal substrate.

The single crystalline semiconductor-carbon alloy layer 10 is a single crystalline material including at least one component semiconductor material and carbon. For example, the single crystalline semiconductor-carbon alloy layer 10 may be a single crystalline silicon carbide layer, a single crystalline germanium carbide layer, a single crystalline layer of a carbide of a silicon-germanium alloy, or any other single crystalline alloy of at least one component semiconductor material and carbon. In case the single crystalline semiconductor-carbon alloy layer 10 is a single crystalline silicon carbide layer, the single crystalline silicon carbide layer may have a hexagonal crystal structure or a cubic crystal structure.

The front surface 11 of the single crystalline semiconductor-carbon alloy layer 10 is substantially planar, and may be provided by cutting, cleaving, grinding, and/or polishing. The front surface 11 of the single crystalline semiconductor-carbon alloy layer 10 is not orthogonal to any major crystallographic orientation of the single crystalline semiconductor-carbon alloy layer 10. Specifically, the front surface 11 of the single crystalline semiconductor-carbon alloy layer 10 is slightly miscut relative to a crystallographic orientation of the single crystalline semiconductor-carbon alloy layer 10. Typically, the front surface 11 of the single crystalline semiconductor-carbon alloy layer 10 is slightly miscut relative to a major crystallographic orientation of the single crystalline semiconductor-carbon alloy layer 10. The angle of the miscut is between 0 degree and 3 degrees. Thus, the front surface 11 of the single crystalline semiconductor-carbon alloy layer 10 is at an angle between 88 degrees and 90 degrees, and typically between 88 degrees and 89.999 degrees, and more typically between 88 degrees and 89.99 degrees, with a crystallographic orientation of the single crystalline semiconductor-carbon alloy layer 10. In one embodiment, the surface normal of the front surface 11 of the single crystalline semiconductor-carbon alloy layer 10 deviates from a major crystallographic orientation of the single crystalline semiconductor-carbon alloy layer 10 by an angle not greater than 2 degrees, and preferably by an angle not greater than 1 degree, and more preferably by an angle not greater than 0.3 degrees.

Exemplary major crystallographic orientations of the single crystalline semiconductor-carbon alloy layer 10 include, but are not limited to, <100> orientations, <110> orientations, <111> orientations, <210> orientations, <211> orientations, <221> orientations, <310> orientations, <311> orientations, <320> orientations, <321> orientations, and <322> orientations in case the single crystalline semiconductor-carbon alloy layer 10 has a cubic crystal structure. Exemplary major crystallographic orientations of the single crystalline semiconductor-carbon alloy layer 10 include, but are not limited to, <0001> orientations, <1102> orientations, <1000> orientations, and <1100> orientations in case the single crystalline semiconductor-carbon alloy layer 10 has a hexagonal crystal structure.

In one embodiment, the single crystalline semiconductor-carbon alloy layer 10 can be a commercially available single crystalline substrate of a semiconductor-carbon alloy such as silicon carbide. Currently, silicon carbide substrates having a diameter equal to or greater than 4 inches are commercially available. Such a silicon carbide substrate may have scratches and surface roughness that are typical of commercially available silicon carbide substrates. Appropriate surface clearing such as an ultrasonic clean in a cleaning solution may be performed to remove any impurities on the front surface 11 of the single crystalline semiconductor-carbon alloy layer 10.

Figure 3:
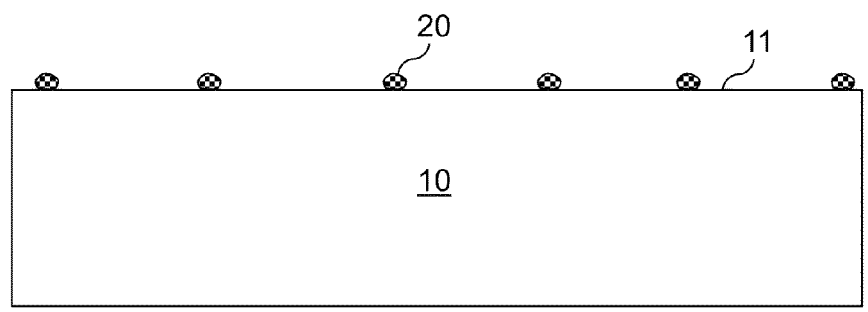
FIG. 3 is a schematic vertical cross-sectional view of the exemplary structure after deposition of semiconductor islands according to an embodiment of the present disclosure.

Referring to FIG. 3, semiconductor islands 20 are deposited on the front surface 11 of the single crystalline semiconductor-carbon alloy layer 10. Each of the semiconductor islands 20 are deposited as a discrete structure that does not contact any other semiconductor island 20. In other words, the semiconductor islands 20 do not contact one another immediately after formation.

In one embodiment, the semiconductor islands 20 include the same semiconductor material as a component semiconductor material of the single crystalline semiconductor-carbon alloy layer 10. The component semiconductor material refers to the non-carbon material of the single crystalline semiconductor-carbon alloy layer 10, which would have formed a semiconductor material but for the presence of the carbon atoms. For example, if the single crystalline semiconductor-carbon alloy layer 10 is a silicon carbide layer, the semiconductor islands 20 may be silicon islands. If the single crystalline semiconductor-carbon alloy layer 10 is a germanium carbide layer, the semiconductor islands 20 may be germanium islands. If the single crystalline semiconductor-carbon alloy layer 10 is a carbide layer of an alloy of silicon and germanium, the semiconductor islands 20 may be islands of a silicon-germanium alloy. If the single crystalline semiconductor-carbon alloy layer 10 is a carbide layer of a compound semiconductor, the semiconductor islands 20 may be islands of the compound semiconductor. In case the single crystalline semiconductor-carbon alloy layer 10 includes more than one component semiconductor material, the composition of the semiconductor islands 20 may, or may not match, the composition of the semiconductor materials in the single crystalline semiconductor-carbon alloy layer 10. For example, if the single crystalline semiconductor-carbon alloy layer 10 is a carbide layer of an alloy of silicon and germanium, the semiconductor islands 20 may be islands of a silicon-germanium alloy, silicon islands, or germanium islands.

The deposition of the semiconductor islands 20 can be effected in many different ways. Optionally, the single crystalline semiconductor-carbon alloy layer 10 can be degassed at an elevated temperature to evaporate any volatile material (e.g., water vapor) from the front surface 10. The degassing may be performed at a temperature from 100° C. to 1,500° C. in a vacuum environment or in an inert ambient gas such as He, Ne, Ar, Kr, and/or Xe. For example, the degassing may be performed in an ultrahigh vacuum, i.e., at a pressure less than $1.0 \times 10^{-6}$ Torr, or in an ambient in which the partial pressure of an inert gas is from $1.0 \times 10^{-6}$ Torr to 760 Torr provided by backfilling a vacuum chamber with the inert gas.

After the optional degassing, the semiconductor islands 20 are deposited. In one embodiment, the semiconductor islands 20 can be deposited by providing a reactant gas to the surface of the single crystalline semiconductor-carbon alloy layer 10 in a process chamber, which can be a vacuum chamber. The reactant gas can be a compound including the component semiconductor material. For example, if the single crystalline semiconductor-carbon alloy layer 10 is a single crystalline silicon carbide layer, the reactant gas can be a silicon-containing precursor gas such as $Si_2H_6$ (disilane), $SiH_4$ (silane), $SiH_2Cl_2$ (dichlorosilane), $SiHCl_3$ (trichlorosilane), and $SiCl_4$ (silicon tetrachloride). If the single crystalline semiconductor-carbon alloy layer 10 is a single crystalline germanium carbide layer, the reactant gas can be a silicon-containing precursor gas such as $Ge_2H_6$ (digermane), $GeH_4$ (germane), $GeH_2Cl_2$ (germanium dichloride), and $GeCl_4$ (germanium tetrachloride). The reactant gas may be delivered into the process chamber without a carrier gas, or with a carrier gas. The carrier gas may be hydrogen or an inert gas such as He, Ne, Ar, Kr, and/or Xe.

Formation of the semiconductor islands 20 as discrete structures, i.e., structures that do not contact one another, can be effected by depositing the semiconductor islands 20 at a temperature at which surface diffusion of the component semiconductor material is limited. Specifically, the deposition temperature for the semiconductor islands 20 is selected such that the surface diffusion of the semiconductor material of the semiconductor islands 20 is sufficiently limited to prevent formation of a contiguous layer of the semiconductor material.

The selection of a deposition temperature in a range that provides limited surface diffusion induces deposition of the semiconductor material originating from the reactant gas in Volmer-Weber growth mode. In the Volmer-Weber growth mode, the semiconductor adatoms on the front surface 11 of the single crystalline semiconductor-carbon alloy layer 10 form three-dimensional adatom clusters of isolated islands, thereby forming the semiconductor islands 20 as discrete structures. In general, the lateral dimensions of the semiconductor islands can be from 10 nm to 500 nm, and typically from 50 nm to 300 nm, although lesser and greater lateral dimensions can also be formed depending on deposition conditions.

For example, if the single crystalline semiconductor-carbon alloy layer 10 is a single crystalline silicon carbide layer and the reactant gas is disilane, the deposition temperature for the semiconductor islands 20, which are silicon islands in this case, can be performed at a temperature from 500° C. to 850° C., and preferably from 550° C. to 800° C. The flow of the reactant gas, which is disilane in this case, depends on the size of the crystalline silicon carbide layer and the process chamber. For a single crystalline semiconductor-carbon alloy layer 10 in the form of a four-inch diameter substrate, the disilane flow of 0.1 sccm to 100 sccm may be employed depending on the temperature and the presence or absence of a carrier gas. In this example, the deposition time may be from 10 minutes to 12 hours to form silicon islands having a maximum height of about 200 nm.

In another embodiment, the semiconductor islands 20 are deposited by providing a molecular beam of the component semiconductor material to the front surface 11 of the single crystalline semiconductor-carbon alloy layer 10. The molecular beam may be generated from a heated source that evaporates the component semiconductor material, e.g., silicon, germanium, or a compound semiconductor material. The heated source may be an effusion cell, an electron-beam heated evaporation source, or any other device configured to generate a continuous or periodic beam of the compound semiconductor material. The molecular beam of the component semiconductor material may be directed to the front surface 11 in an ultrahigh vacuum environment or in an ambient including hydrogen or an inert gas such as He, Ne, Ar, Kr, and/or Xe.

As in the case of deposition from a reactant gas, the deposition temperature for formation of the semiconductor islands 20 from a molecular beam is selected such that the surface diffusion of the semiconductor material of the semiconductor islands 20 is sufficiently limited to prevent formation of a contiguous layer of the semiconductor material. The selection of a deposition temperature in a range that provides limited surface diffusion induces deposition of the semiconductor material originating from the reactant gas in Volmer-Weber growth mode. In general, the lateral dimensions of the semiconductor islands can be from 10 nm to 500 nm, and typically from 50 nm to 300 nm, although lesser and greater lateral dimensions can also be formed depending on deposition conditions.

For example, if the single crystalline semiconductor-carbon alloy layer 10 is a single crystalline silicon carbide layer and the molecular beam is a beam of silicon atoms, the deposition temperature for the semiconductor islands 20, which are silicon islands in this case, can be performed at a temperature from 500° C. to 850° C., and preferably from 550° C. to 800° C. In this example, the deposition time may be from 10 minutes to 12 hours to form silicon islands having a maximum height of about 200 nm.

Figure 4A:
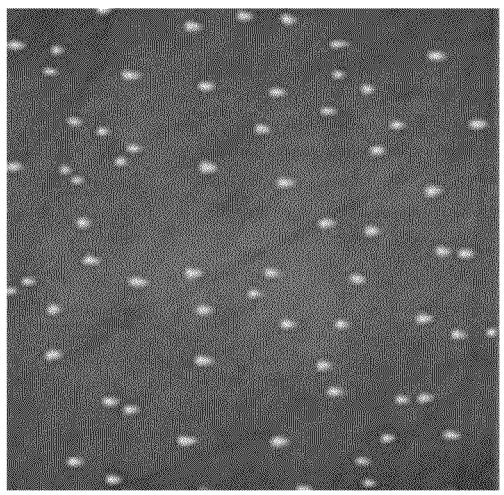
FIGS. 4A, 4B, 4C, and 4D are atomic force microscopy (AFM) images of a sample of a single crystalline silicon carbide surface on which silicon islands are formed according to an embodiment of the present disclosure.
Figure 4B:
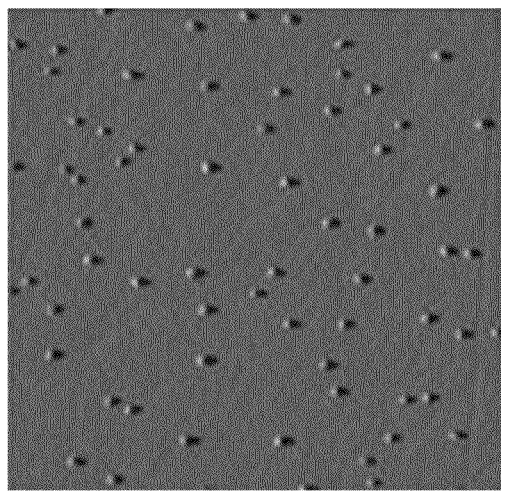

Referring to FIGS. 4A and 4B, atomic force microscopy (AFM) images of an area including silicon islands on a single crystalline silicon carbide surface are shown. FIG. 4A is a 10 μm×10 μm image of the area generated in the height mode, in which the brightness of the image is proportional to the vertical displacement of the tip of the AFM probe. FIG. 4B is a 10×10 μm image of the same area generated the amplitude mode, in which the brightness of the image is proportional to changes in the phase of the measured signal, and is related to the spatial derivative of the height of the tip of the AFM probe.

Figure 4C:
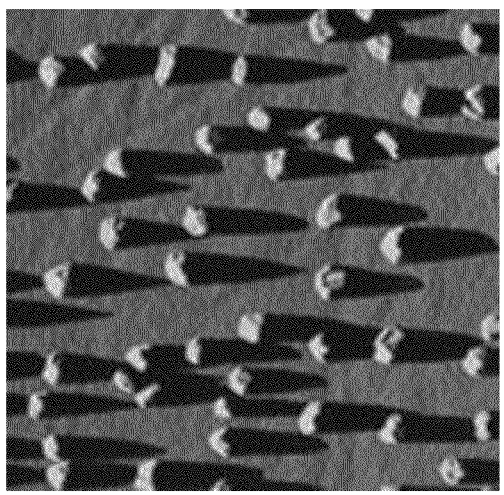

Referring to FIG. 4C, another AFM image shows silicon islands formed on a single crystalline silicon carbide surface. FIG. 4C is an image of a 5 μm×5 μm area.

Figure 4D:
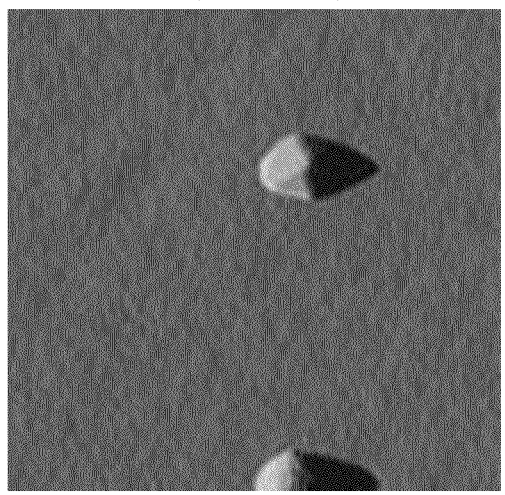

Referring to FIG. 4D, yet another AFM image shows silicon islands formed on a single crystalline silicon carbide surface. FIG. 4D is an image of a 1.5 μm×1.5 μm area.

The images of FIGS. 4A-4D show examples of silicon islands that are formed on the surface of a silicon carbide layer. While the images of FIGS. 4A-4D show silicon islands having a lateral dimension of about 150 nm, changes in the deposition conditions can alter the lateral dimensions of the silicon islands. The silicon islands do not contact one another.

Figure 5:
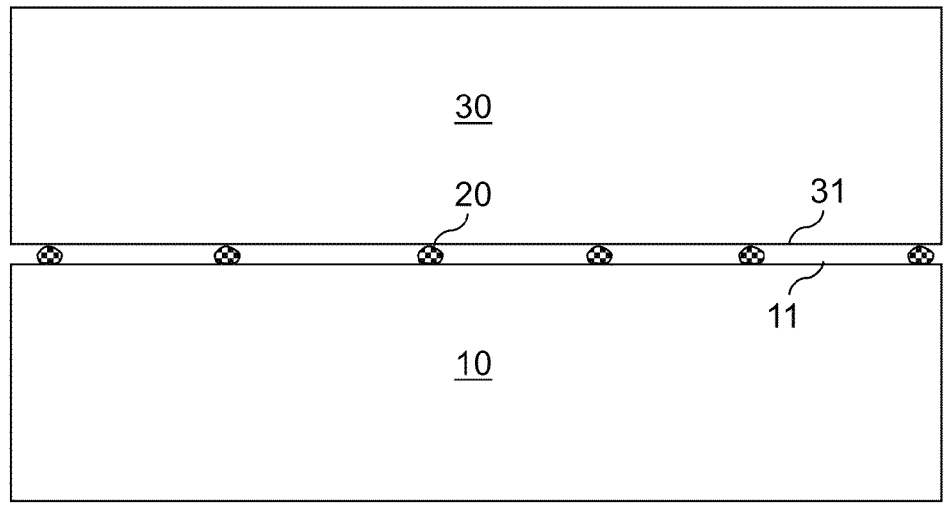
FIG. 5 is a schematic vertical cross-sectional view of the exemplary structure after placement of a substrate according to an embodiment of the present disclosure.

Referring to FIG. 5, a substrate 30 having a second front surface 31 is placed on the silicon islands 20 such that the second front surface 31 contacts some of the semiconductor islands 20. The substrate 30 is placed such that the second front surface 31 faces the front surface 11 of the single crystalline semiconductor-carbon alloy layer 10.

The substrate 30 can be another single crystalline semiconductor-carbon alloy layer, which may, or may not, have the same composition as the single crystalline semiconductor-carbon alloy layer 10. If the substrate 30 is another single crystalline semiconductor-carbon alloy layer, the second front surface 31 can be substantially planar. Like the front surface 11 of the single crystalline semiconductor-carbon alloy layer 10, the second front surface 31 may be provided by cutting, cleaving, grinding, and/or polishing. Further, the second front surface 31 of the other single crystalline semiconductor-carbon alloy layer of the substrate 30 is not orthogonal to any major crystallographic orientation of the other single crystalline semiconductor-carbon alloy layer of the substrate 30. Specifically, the second front surface 31 of the other single crystalline semiconductor-carbon alloy layer of the substrate 30 is slightly miscut relative to a crystallographic orientation of the other single crystalline semiconductor-carbon alloy layer of the substrate 30. Typically, the second front surface 31 of the other single crystalline semiconductor-carbon alloy layer of the substrate 30 is slightly miscut relative to a major crystallographic orientation of the other single crystalline semiconductor-carbon alloy layer of the substrate 30. The angle of the miscut is between 0 degree and 3 degrees. Thus, the second front surface 31 of the other single crystalline semiconductor-carbon alloy layer of the substrate 30 is at an angle between 88 degrees and 90 degrees, and typically between 88 degrees and 89.999 degrees, and more typically between 88 degrees and 89.99 degrees, with a crystallographic orientation of the other single crystalline semiconductor-carbon alloy layer of the substrate 30. In one embodiment, the surface normal of the second front surface 31 of the other single crystalline semiconductor-carbon alloy layer of the substrate 30 deviates from a major crystallographic orientation of the other single crystalline semiconductor-carbon alloy layer of the substrate 30 by an angle not greater than 2 degrees, and preferably by an angle not greater than 1 degree, and more preferably by an angle not greater than 0.3 degrees.

Alternately, the substrate 30 may include a material having a high melting temperature and a low vapor pressure such as a refractory metal or a dielectric material such as sapphire (aluminum oxide) or diamond. In this case, the second front surface 31 of the substrate 30 can be a surface of a refractory metal or a surface of a dielectric material having a high melting point, i.e., a melting point higher than the temperature of the anneal, and a low vapor pressure, i.e., a vapor pressure that does not affect the surface properties of the front surface 11 at a subsequent anneal step.

In one embodiment, the substrate 30 is another single crystalline semiconductor-carbon alloy layer which has the same composition as the single crystalline semiconductor-carbon alloy layer 10. For example, the single crystalline semiconductor-carbon alloy layer 10 and the substrate 30 can be single crystalline silicon carbide layers and the semiconductor islands 20 can be silicon islands.

While FIG. 5 schematically represents semiconductor islands 20 that contact the second front surface 31 of the substrate 30, not every semiconductor island 20 contacts the second front surface 31 because the front surface 11 of the single crystalline semiconductor-carbon alloy layer 10 and the second front surface 31 of the substrate 30 may have global topography such as a bow or local topography such as scratches or steps derived from surface preparation.

The assembly of the single crystalline semiconductor-carbon alloy layer 10, the semiconductor islands 20, and the substrate 30 is placed in a process chamber, which may be the same chamber employed for formation of the semiconductor islands 20 or may be a different chamber. The process chamber may be a vacuum enclosure or may be configured to maintain a controlled ambient including an inert gas. The process chamber is provided with a heating mechanism to enable annealing of the assembly of the single crystalline semiconductor-carbon alloy layer 10, the semiconductor islands 20, and the substrate 30.

The anneal may be performed in an ultrahigh vacuum environment, i.e., at a pressure below $1.0 \times 10^{-6}$ Torr, or may be performed in an inert ambient containing an inert gas such as He, Ne, Ar, Xe, and/or Kr. If an ambient gas is employed, the pressure of the ambient gas may be from 0.1 mTorr to 760 Torr, and typically from 1 mTorr to 100 mTorr.

The temperature of the anneal is selected so that the semiconductor material of the semiconductor islands 20 evaporates at a significant rate during the anneal. Specifically, the temperature of the anneal can be selected to be above the melting temperature of the semiconductor material of the semiconductor islands 20 so that the semiconductor material evaporates during the anneal. For example, if the single crystalline semiconductor-carbon alloy layer 10 is a silicon carbide layer and the semiconductor islands 20 are silicon islands, the anneal can be performed at a temperature greater than 1,414° C. If the single crystalline semiconductor-carbon alloy layer 10 is a germanium carbide layer and the semiconductor islands 20 are germanium islands, the anneal can be performed at a temperature greater than 938.25° C. The anneal temperature for a single crystalline semiconductor-carbon alloy layer 10 having a different composition can be determined based on the composition of the semiconductor islands 20. In general, the anneal temperature can be selected so that the entirety of the semiconductor islands 20 can be evaporated in a time period ranging from 10 seconds to 1 hour, and preferably from 30 seconds to 10 minutes, although longer and shorter time periods can also be employed. In general, the annealing is performed at a temperature that induces evaporation of the semiconductor islands 20 from between the front surface 11 of the single crystalline semiconductor-carbon alloy layer 10 and second front surface 31 of the substrate 30.

Figure 6:
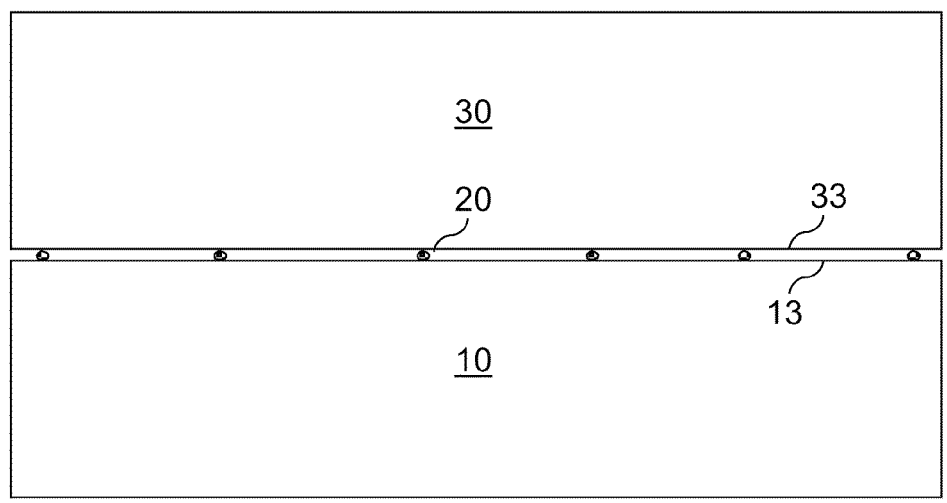
FIG. 6 is a schematic vertical cross-sectional view of the exemplary structure during an anneal of an assembly including the single crystalline semiconductor-carbon alloy layer and the substrate with the semiconductor islands therebetween according to an embodiment of the present disclosure.

Referring to FIG. 6, the structure of the assembly is shown during the anneal. The assembly includes the single crystalline semiconductor-carbon alloy layer 10, the semiconductor islands 20, and the substrate 30. The size of the semiconductor islands 20 shrink during the anneal as the semiconductor material evaporates from the semiconductor islands 20 in the from of an atomic vapor. The space between the front surface 11 of the single crystalline semiconductor-carbon alloy layer 10 and the second front surface 31 of the substrate 30 maintains a high vapor pressure of the semiconductor material, which is evaporated from the semiconductor islands 20.

The range of the distance between the front surface 11 of the single crystalline semiconductor-carbon alloy layer 10 and the second front surface 31 of the substrate 30 is the greater of the combined surface roughness of the front surface 11 and the second front surface 31 and the vertical dimension of the semiconductor islands 20. Typically, the combined surface roughness of the front surface 11 and the second front surface 31 is on the order of several microns, and the vertical dimension of the semiconductor islands 20 is less than 1 micron. The lateral dimensions of the single crystalline semiconductor-carbon alloy layer 10 and the substrate 30 are on the order of several inches. Thus, the geometry of the assembly of the single crystalline semiconductor-carbon alloy layer 10, the semiconductor islands 20, and the substrate 30 is conducive to maintaining a high vapor pressure of the semiconductor material of the semiconductor islands 20 throughout the space between the front surface 11 and the second front surface 31 throughout the anneal.

The high vapor pressure of the semiconductor material of the semiconductor islands 20 in the space between the front surface 11 and the second front surface 31 provides a sufficient influx of semiconductor atoms to the front surface 11 and the second front surface 31. Because of the constant influx of the semiconductor atoms, semiconductor atoms selectively evaporated from the front surface 31 of the single crystalline semiconductor-carbon alloy layer 10 is constantly replenished by other semiconductor atoms from the semiconductor islands 20. Selective evaporation of the semiconductor atoms refers to loss of semiconductor atoms while carbon atoms do not evaporate proportionally from the surface of a semiconductor-carbon alloy. Thus, the high vapor pressure of the semiconductor material of the semiconductor islands 20 has the effect of retarding the selective loss of semiconductor atoms from the single crystalline semiconductor-carbon alloy layer 10 and preventing initiation of graphitization, i.e., formation of a layer including only carbons on the surface of a semiconductor-carbon alloy.

While the graphitization is postponed, the high temperature of the anneal process provides sufficient mobility to the semiconductor atoms and the carbon atoms on the front surface 11 of the single crystalline semiconductor-carbon alloy layer 10. This results in rearrangement of microscopic defects on the front surface 11 of the single crystalline semiconductor-carbon alloy layer 10. The microscopic defects are healed during the anneal. The microscopic surfaces, or ledges that are perpendicular to a major crystallographic orientation, are formed and grows. The major crystallographic orientation slightly deviates from the macroscopic orientation of the front surface 11. The process of formation of ledges on a microscopic scale results in conversion of the front surface 11 into a vicinal surface 13 during the annealing.

If the substrate 30 is another single crystalline semiconductor-carbon alloy layer, the high vapor pressure of the semiconductor material of the semiconductor islands 20 has the same effect of retarding the selective loss of semiconductor atoms from the other single crystalline semiconductor-carbon alloy layer of the substrate 30 and preventing initiation of graphitization on the second front surface 31. While the graphitization is postponed on the second front surface 31, the high temperature of the anneal process provides sufficient mobility to the semiconductor atoms and the carbon atoms on the second front surface 31 of the other single crystalline semiconductor-carbon alloy layer of the substrate 30. This results in rearrangement of microscopic defects on the second front surface 31 of the other single crystalline semiconductor-carbon alloy layer of the substrate 30, in which the microscopic defects are healed and microscopic surfaces, or ledges, that are perpendicular to a major crystallographic orientation that slightly deviates from the macroscopic orientation of the second front surface 31. While the graphitization is postponed, the high temperature of the anneal process provides sufficient mobility to the semiconductor atoms and the carbon atoms on the second front surface 31 of the single crystalline semiconductor-carbon alloy layer of the substrate 30. The same mechanism that operates on the front surface 11 causes the conversion of the second front surface 31 into a second vicinal surface 33 during the annealing.

For example, if the single crystalline semiconductor-carbon alloy layer 10 and the substrate 30 can be single crystalline silicon carbide layers, and the vicinal surface 13 and the second vicinal surface 33 can be vicinal surfaces of silicon carbide layers.

Figure 7:
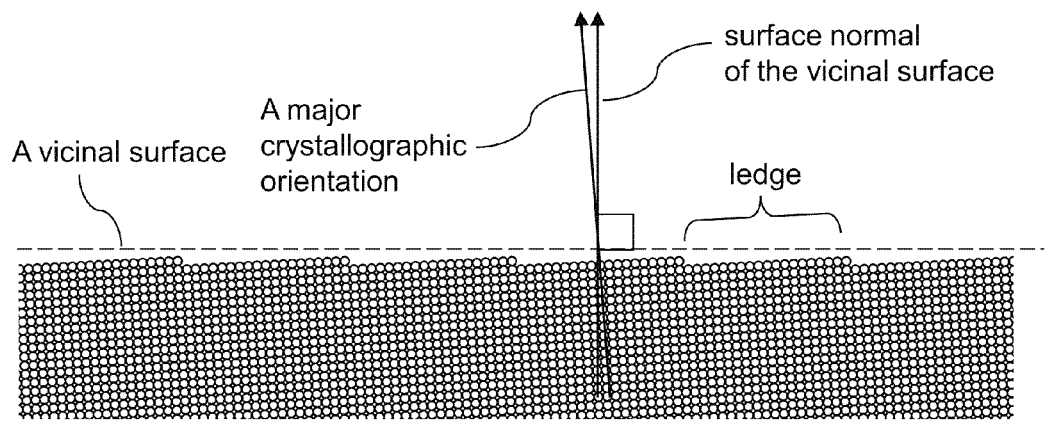
FIG. 7 is a schematic vertical cross-sectional view of an exemplary substrate having a vicinal surface according to an embodiment of the present disclosure.

Referring to FIG. 7, a schematic vertical cross-sectional view of a substrate illustrates the concept of a vicinal surface formed according to an embodiment of the present disclosure. Each circle represents a unit of a crystal structure, which may be a unit cell. The vicinal surface includes ledges separated by steps, which has the height of a single atomic bilayer. The vicinal surface may be viewed as a collection of periodically arranged or near-periodically arranged ledges having a major crystallographic orientation in which each step has the height of a single atomic layer. The width of each ledge may be regular, or may be irregular with a statistical distribution of widths. The vicinal surface can have at least 10 atoms along a widthwise direction of a single ledge (between two adjacent steps along an almost horizontal direction in FIG. 7), and typically has at least 30 atoms along the widthwise direction of a single ledge, and more typically has about 100 atoms or more along the widthwise direction of a single ledge.

Correspondingly, the angle between the surface normal and the major crystallographic orientation is relatively small, and, for example, is from 0 degree to 2 degrees, and typically is from 0 degree to 1 degree. Because a vicinal surface is not along any major crystallographic orientation, at least one of the Miller indices is a significantly large number. For example, at least one of the Miller indices representing the vicinal surface is greater than 6, and is typically greater than 30.

Vicinal surfaces are known to provide benefits for certain applications. For example, a vicinal surface of silicon carbide may be able to provide a high quality graphene layer. A graphene monolayer has a thickness of about 0.34 nm, i.e., which is approximately the atomic diameter of a single carbon atom.

Figure 8:
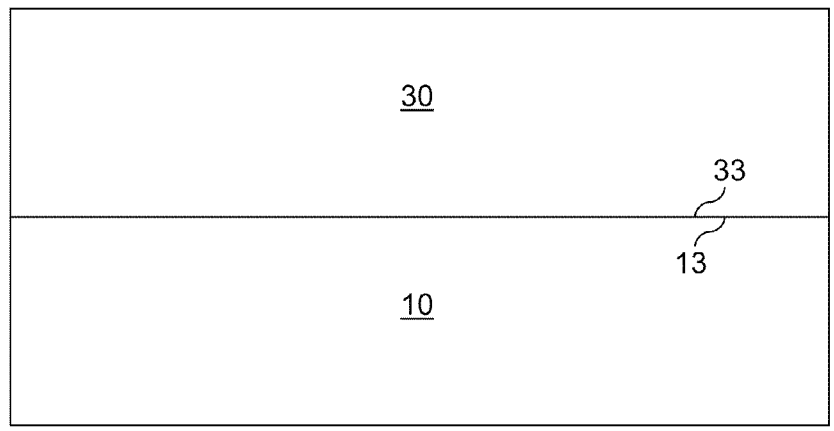
FIG. 8 is a schematic vertical cross-sectional view of a first exemplary structure after an anneal according to a first embodiment of the present disclosure.

Referring to FIG. 8, the evaporation of the semiconductor islands 20 continues during the anneal until the semiconductor islands 20 disappear from the assembly of the single crystalline semiconductor-carbon alloy layer 10, the semiconductor islands 20, and the substrate 30. At this point, the assembly includes only the single crystalline semiconductor-carbon alloy layer 10 and the substrate 30. The single crystalline semiconductor-carbon alloy layer 10 has the vicinal surface 13. The substrate 30 may have the second vicinal surface 33 if the substrate 30 includes the other single crystalline semiconductor-carbon alloy layer. Local gaps (not shown) may be present between the vicinal surface 13 of the single crystalline semiconductor-carbon alloy layer 10 and the substrate 30 due to the macroscopic and microscopic topography of the vicinal surface 13 of the single crystalline semiconductor-carbon alloy layer 10 and the second vicinal surface 33 (or the second front surface 31 if the substrate 30 does not include another single crystalline semiconductor-carbon alloy layer).

Figure 9:
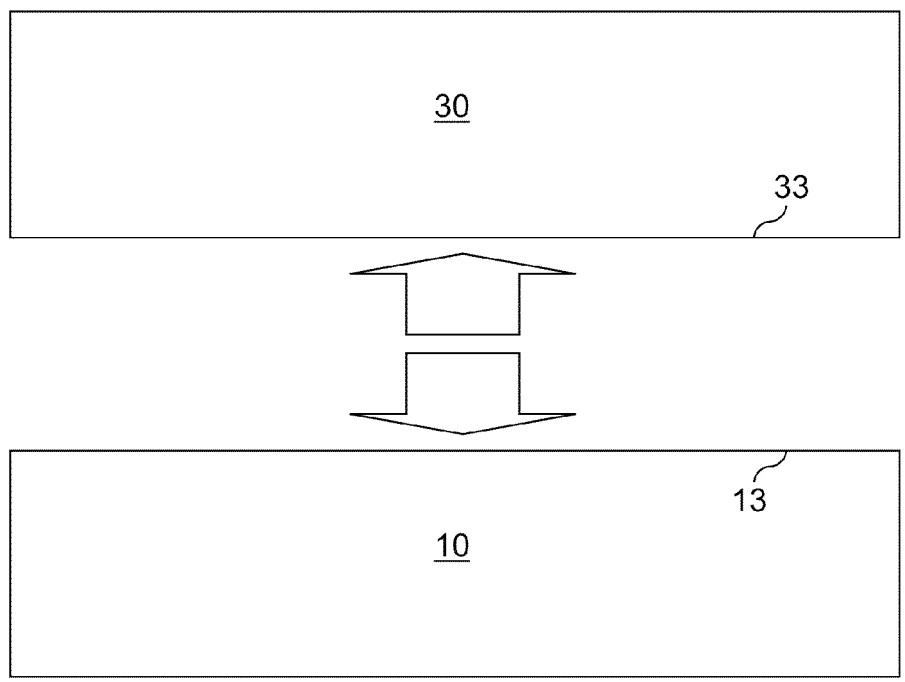
FIG. 9 is a schematic vertical cross-sectional view of the first exemplary structure after separation of the single crystalline semiconductor-carbon alloy layer and the substrate according to the first embodiment of the present disclosure.

Referring to FIG. 9, the anneal may be stopped immediately before any significant graphitization takes place, e.g., immediately after consumption of all semiconductor islands 20, according to a first embodiment of the present disclosure. The single crystalline semiconductor-carbon alloy layer 10 and the substrate 30 may be cooled to room temperature, taken out of the process chamber, and be separated from each other to provide the single crystalline semiconductor-carbon alloy layer 10 having the vicinal surface 13. If the substrate 30 includes another single crystalline semiconductor-carbon alloy layer, a second vicinal surface 33 may be provided on a surface of the substrate 30.

Figure 10:
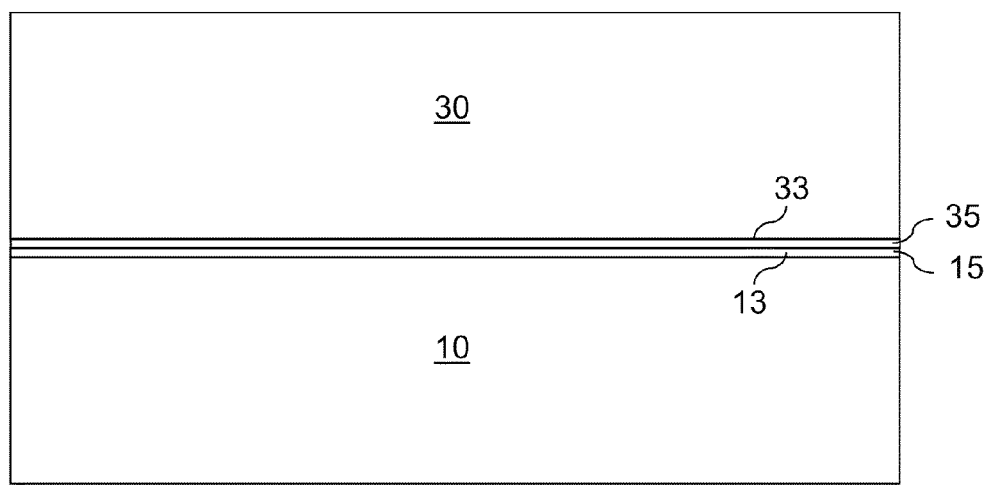
FIG. 10 is a schematic vertical cross-sectional view of a second exemplary structure after formation of a graphene layer according to a second embodiment of the present disclosure.

Referring to FIG. 10, the anneal may be continued at the same temperature or at a different temperature to induce graphitization on the vicinal surface 13 of the single crystalline semiconductor-carbon alloy layer 10 according to a second embodiment of the present disclosure. Once the entirety of the semiconductor islands is consumed, the vapor pressure of the semiconductor material in the space between the single crystalline semiconductor-carbon alloy layer 10 and the substrate 30 are drastically reduced. As a result, a surface layer including an excess of carbon atoms relatively to the composition of the semiconductor-carbon alloy is formed on the surface of the single crystalline semiconductor-carbon alloy layer 10. A graphene layer 15 including at least one graphene monolayer can be formed at the vicinal surface as semiconductor atoms evaporate from the vicinal surface 13. The semiconductor atoms that evaporate from the vicinal surface 13 reduce the semiconductor content of the vicinal surface, and the remaining carbon atoms coalesce to form the graphene layer 15. In one embodiment, the graphene layer 15 may have an epitaxial alignment with the underlying crystalline structure of the single crystalline semiconductor-carbon alloy layer 10.

The graphene layer 15 can exist as a monolayer of a two-dimensional sheet. Alternately, the graphene layer 15 can exist as a stack of a plurality of two-dimensional monolayers of carbon, which do not exceed more than 10 monolayers and is typically limited to less than 5 monolayers. Graphene provides excellent in-plane conductivity. In the graphene layer 15, carbon atoms are arranged in a two-dimensional honeycomb crystal lattice in which each carbon-carbon bond has a length of about 0.142 nm. The graphene layer 15 on the vicinal surface 13 of the single crystalline semiconductor-carbon alloy layer 10 can be a high quality graphene layer having sufficient width to provide two-dimensional properties to all areas of the graphene layer 15. As such, semiconductor devices employing the graphene layer 15 can be fabricated on the single crystalline semiconductor-carbon alloy layer 10 to provide high-density, high-switching-speed semiconductor circuits.

Each monolayer within the graphene layer 15 formed on the vicinal surface 13 of the single crystalline semiconductor-carbon alloy layer 10 typically has a substantial width, which corresponds to the width of a ledge of the vicinal surface 13. As such, each monolayer of the graphene layer 15 has a minimal width at each location, which provides the graphene layer 15 a two-dimensional characteristic over a wide area. By forming a high quality vicinal surface 13 that is more periodic and less defective than original surfaces provided by mechanical means alone, the quality of the graphene layer 15 according to this embodiment of the present disclosure is enhanced. Because the graphene layer 15 follows the contour of the underlying vicinal surface 13, the outer surface of the graphene layer 15 is also a vicinal surface, i.e., a vicinal surface of the graphene layer 15.

In case the substrate 30 includes another single crystalline semiconductor-carbon alloy layer, a second graphene layer 35 can be formed on the second vicinal surface 33 of the other crystalline semiconductor-carbon alloy layer in the substrate 30. The second graphene layer 35 includes at least one graphene monolayer like the graphene layer 15 on the single crystalline semiconductor-carbon alloy layer 10. In case each of the single crystalline semiconductor-carbon alloy layer 10 and the substrate 30 includes a single crystalline silicon carbide layer, the graphene layer 15 and the second graphene layer 35 are formed on the vicinal surface 13 and the second vicinal surface 33, respectively. In this case, the vicinal surface 13 and the second vicinal surface 35 can include ledges having a width greater than 100 nm and steps having a height of a single monolayer of silicon carbide between adjacent ledges.

Figure 11:
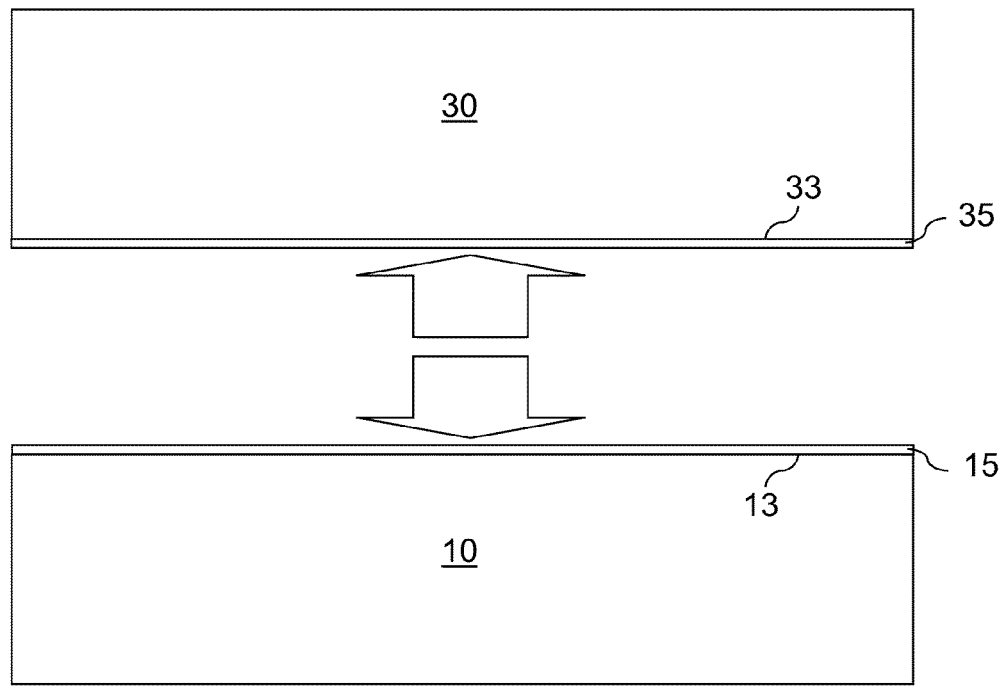
FIG. 11 is a schematic vertical cross-sectional view of the second exemplary structure after separation of the single crystalline semiconductor-carbon alloy layers and the substrate according to the second embodiment of the present disclosure.

Referring to FIG. 11, The single crystalline semiconductor-carbon alloy layer 10 and the substrate 30 may be cooled to room temperature, taken out of the process chamber, and be separated from each other to provide the single crystalline semiconductor-carbon alloy layer 10 having the vicinal surface 13.

Figure 12A:
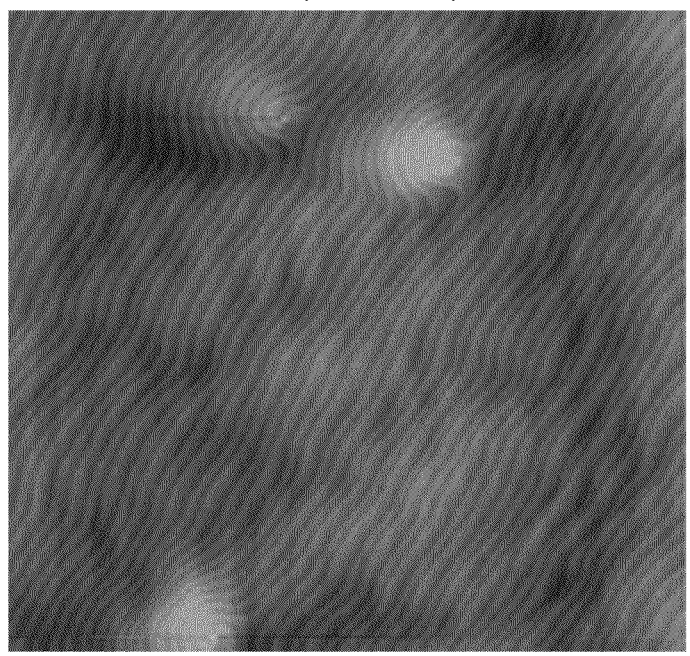
FIGS. 12A, 12B, and 12C are atomic force microscopy (AFM) images of vicinal surfaces including a graphene layer on silicon carbide substrate samples annealed according to the second embodiment of the present disclosure.
Figure 12B:
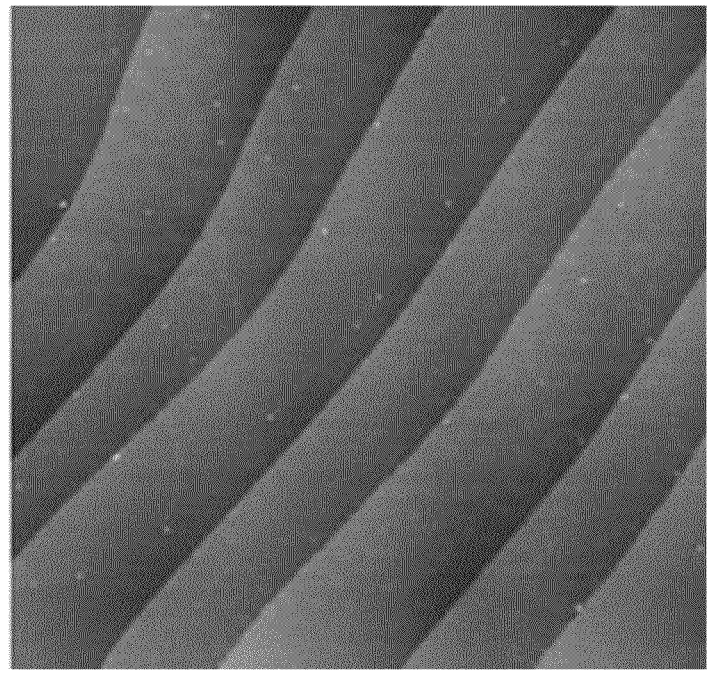
Figure 12C:
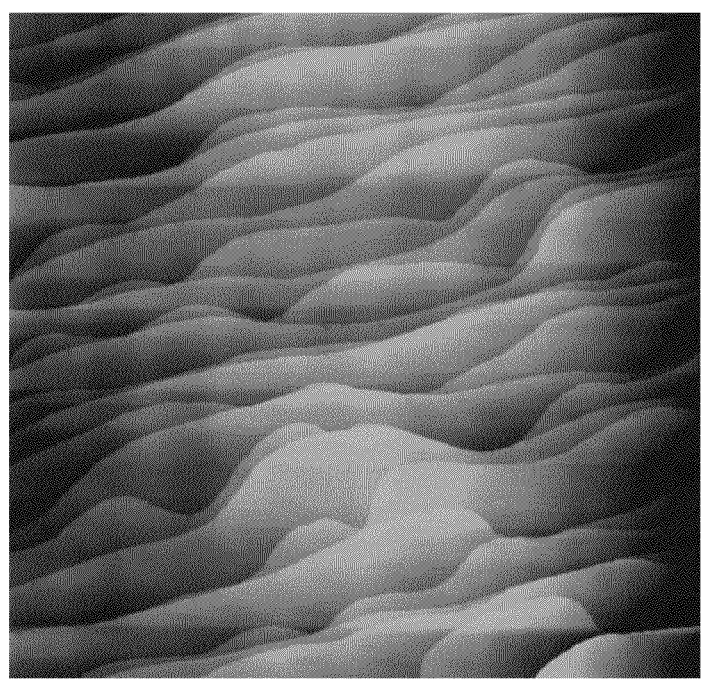

Referring to FIGS. 12A, 12B, and 12C, atomic force microscopy (AFM) images of vicinal surfaces including a graphene layer are shown. The graphene layer was formed on a silicon carbide substrate sample having a diameter of about four inches. Silicon islands were deposited on the silicon carbide substrate sample, and another silicon carbide substrate was placed on the silicon islands according to the methods of the present disclosure as described above. The assembly of the silicon carbide substrate sample, the silicon islands, and the other silicon carbide substrate was annealed at 1,450° C. for about two minutes. After formation of the graphene layer on the silicon carbide substrate sample, the AFM images were taken from the silicon carbide substrate sample.

FIG. 12A is 40 µm×40 µm image of a center area of the silicon carbide substrate sample as generated in the height mode, in which the brightness of the image is proportional to the vertical displacement of the tip of the AFM probe. FIG. 12B is a 5 µm×5 µm image of another center area of the silicon carbide substrate sample generated the height mode. FIG. 12C is a 20×20 µm image of an edge area of the silicon carbide substrate sample generated the height mode.

The lines in each of the AFM images of FIGS. 12A-12C correspond to atomic steps between adjacent ledges in a graphene layer, which corresponds to underlying atomic steps in the silicon carbide layer. The images of FIGS. 12A-12C show that the center area of the silicon carbide substrate sample, which was subjected to a higher vapor pressure of silicon during the anneal than the edge areas of the silicon carbide substrate sample, provides a better uniformity in the distribution of the widths of ledges. However, even the edge area of the silicon carbide substrate sample, as evidenced by the AFM image of FIG. 12C, shows significantly wide ledges having a lateral dimension on the order of one micron. When compared with the AFM image of FIG. 1 that does not show any sign of vicinal surfaces on the surface, the AFM images of FIGS. 12A-12C show that vicinal surfaces are present in the silicon carbide substrate sample, and that the presence of the vicinal surface has a beneficial effect of providing a high quality graphene layer.

Figure 13:
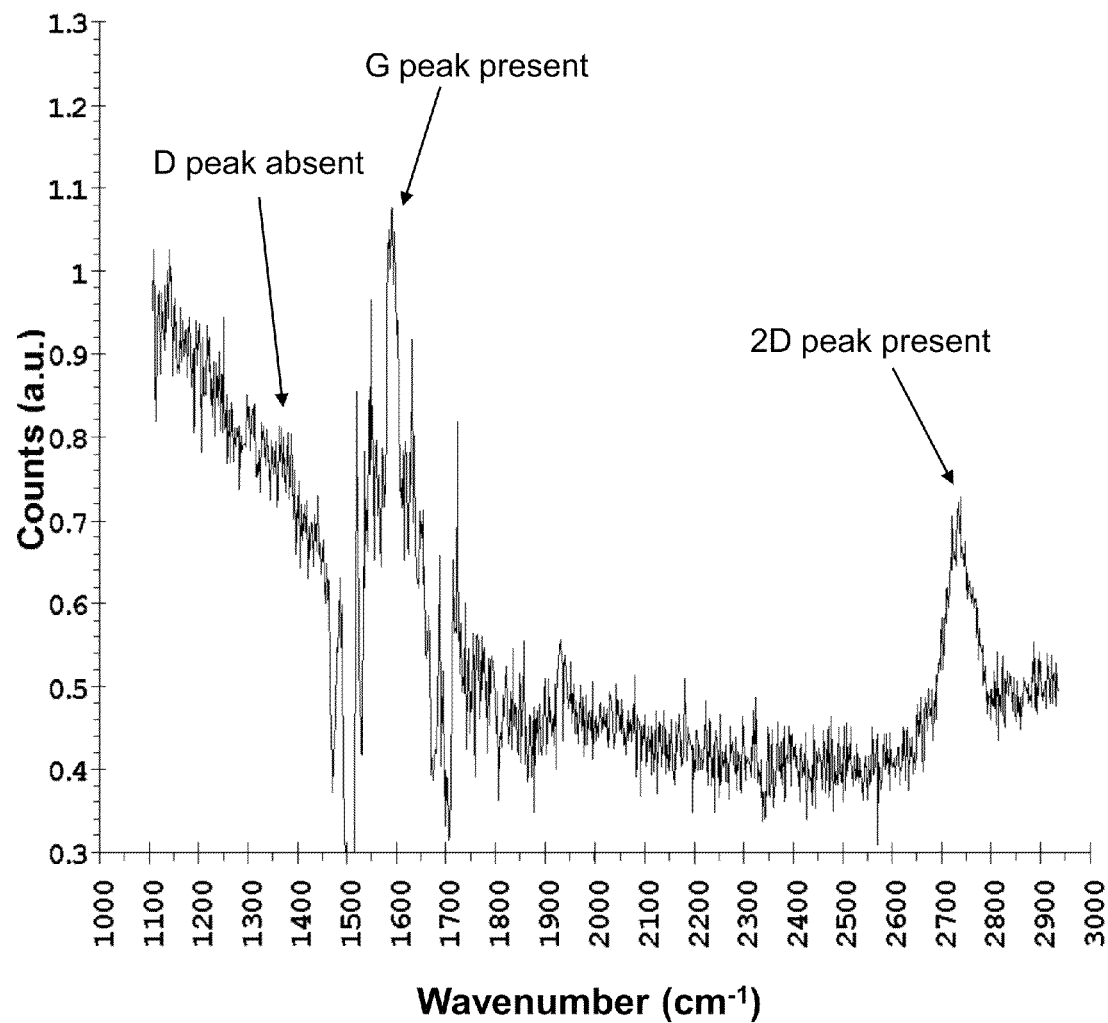
FIG. 13 is a graph showing the Raman spectroscopy data from a surface of a sample of a vicinal surface including a graphene layer formed on a silicon carbide substrate sample annealed according to the second embodiment of the present disclosure.

Referring to FIG. 13, the Raman spectroscopy data from a surface of the silicon carbide substrate sample employed to generate the AFM images of FIGS. 12A-12C. The horizontal axis shows the wavenumber, and the vertical axis shows the count in an arbitrary unit. The Raman spectrum shows the presence of a G-peak around 1,600 cm$^{-1}$ and a 2D peak around 2,750 cm$^{-1}$. Further, there is a conspicuous absence of a D-peak at 1,350 cm$^{-1}$ that is attributed to defects. The combination of the presence of the G-peak and the 2D peak and the absence of the D-peak shows that the graphene layer of the silicon carbide substrate sample is a high quality graphene layer free of defects. The pattern of the Raman spectrum suggests that the graphene layer on the silicon carbide substrate sample is one monolayer thick.

Various devices can be formed employing a graphene layer 15 on a single crystalline semiconductor-carbon alloy layer 10 formed by the methods described above. Such devices can include a graphene-based field effect transistor, i.e., a "graphene FET," or any other electronic devices employing the electronic transport properties of the graphene layer 15.

Figure 14:
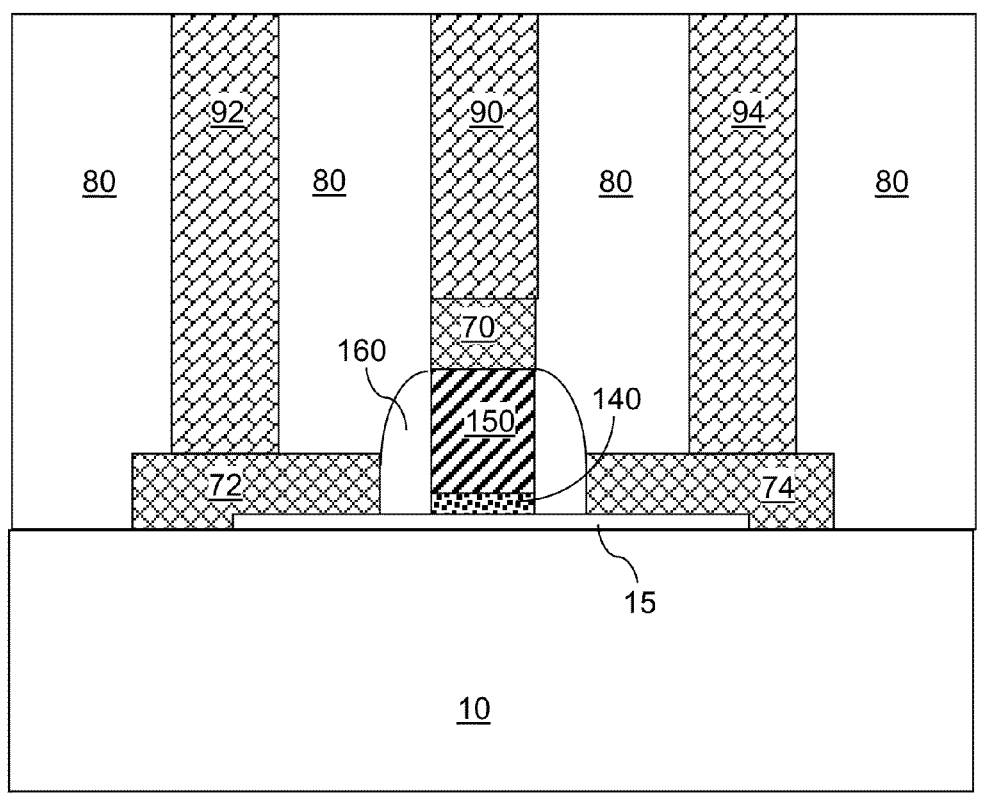
FIG. 14 is a vertical cross-sectional view of an exemplary graphene-based field effect transistor according to an embodiment of the present disclosure.

Referring to FIG. 14, an exemplary graphene-based field effect transistor (graphene FET) according to an embodiment of the present disclosure can be formed employing a graphene layer 15 on a single crystalline semiconductor-carbon alloy layer 10 as an exemplary application. The structure of a graphene FET and the method of manufacturing the same described herein are non-limiting embodiments, and any other compatible structure or method for a graphene FET can also be employed.

Lithography techniques can be employed to define the dimensions of a graphene based device to be formed. The lithographic patterning of the graphene layer 15 can be effected by masking the desired area of the graphene layer 15 with a photoresist (photoresist), which can be, for example, a layer of poly(methyl methacrylate), i.e., PMMA. The photoresist is lithographically patterned by exposure and development into a desired pattern, which can be, for example, a rectangular pattern such that the width of the patterned photoresist is the desired width for the channel of a graphene based transistor to be subsequently formed. Employing the photoresist as an etch mask, the exposed portions of the graphene layer 15 can be etched, for example, by subjecting to oxygen plasma the unmasked portions of the graphene layer 15. The photoresist 27 is then removed, for example, by dissolving in a solvent.

A gate dielectric 140 and a gate electrode 150 are formed on a portion of the graphene layer 15. In one embodiment, the gate dielectric 140 can include a dielectric metal oxide, which can be deposited employing methods known in the art including, but not limited to, chemical vapor deposition (CVD), atomic layer deposition (ALD), or a combination of thereof. The dielectric metal oxide may include a high-k dielectric material having a dielectric constant greater than 4.0, or any suitable combination of these materials. Exemplary high-k dielectric materials include dielectric metal oxides and dielectric metal oxynitrides such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. Alternately or in addition, the gate dielectric 140 can include silicon oxide, silicon nitride, silicon oxynitride, or a combination thereof.

The gate electrode 150 includes a conductive material, such as a metallic material and/or a doped semiconductor material. A dielectric material layer can be deposited in a conformal deposition step and anisotropically etched to form a dielectric gate spacer 160 that laterally surround the stack of the gate dielectric 140 and the gate electrode 150.

Referring to FIGS. 8 and 8A, contact metal portions are deposited on the exemplary structure by method known in the art and lithographically pattered to form a gate electrode 70, a source electrode 72, and a drain electrode 74. Typically, the gate electrode 70, the source electrode 72, and the drain electrode 74 include a conductive material, which is typically a metal.

A contact level dielectric material layer 80 and conductive contact via structures can be formed. The contact level dielectric material layer 80 can be a homogeneous dielectric material layer or can be a stack of a plurality of different dielectric material layers. The conductive contact via structures can be formed by etching via cavities in the contact level dielectric material layer 80 and filling the via cavities with a conductive material, followed by removal of the excess conductive material from above the top surface of the contact level dielectric material layer 80. The conductive contact via structures include a gate-side contact via structure 90 contacting the gate electrode 70, a source-side contact via structure 92 contacting the source electrode 72, and a drain-side contact via structure 94 contacting the drain electrode 74. The gate-side contact via structure 90, the source-side contact via structure 92, and the drain-side contact via structure 94 are embedded in the contact level dielectric material layer 80.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a structure, said method comprising:
    depositing semiconductor islands on a surface of a single crystalline semiconductor-carbon alloy layer by adding a semiconductor material onto said surface of said single crystalline semiconductor-carbon alloy layer, said semiconductor islands having a different composition than said single crystalline semiconductor-carbon alloy layer and including a non-carbon material of said single crystalline semiconductor-carbon alloy layer and not including carbon; and
    annealing said single crystalline semiconductor-carbon alloy layer while a substrate is placed on said semiconductor islands, wherein said surface of said single crystalline semiconductor-carbon alloy layer becomes a vicinal surface during said annealing.

2. The method of claim 1, wherein said semiconductor islands comprise a same semiconductor material as a component semiconductor material of said single crystalline semiconductor-carbon alloy layer.

3. The method of claim 2, wherein said semiconductor islands are deposited by providing a reactant gas that is a compound including said component semiconductor material to said surface of said single crystalline semiconductor-carbon alloy layer.

4. The method of claim 2, wherein said semiconductor islands are deposited by providing a molecular beam of said component semiconductor material to said surface of said single crystalline semiconductor-carbon alloy layer.

5. The method of claim 2, wherein said semiconductor islands are deposited at a temperature at which surface diffusion of said component semiconductor material is sufficiently limited to prevent formation of a contiguous layer of said component semiconductor material.

6. The method of claim 1, wherein said semiconductor islands do not contact one another immediately after formation.

7. The method of claim 1, wherein said annealing is performed at a temperature that induces evaporation of said semiconductor islands from between said surface of a single crystalline semiconductor-carbon alloy layer and said substrate.

8. The method of claim 1, wherein said surface of said single crystalline semiconductor-carbon alloy layer is at an angle between 88 degrees and 89.999 degrees with a crystallographic orientation of said single crystalline semiconductor-carbon alloy layer.

9. The method of claim 1, wherein said single crystalline semiconductor-carbon alloy layer is a single crystalline silicon carbide layer.

10. The method of claim 9, wherein said semiconductor island are silicon islands.

11. The method of claim 1, wherein said substrate includes another single crystalline semiconductor-carbon alloy layer, wherein a surface of said another single crystalline semiconductor-carbon alloy layer faces said surface of said single crystalline semiconductor-carbon alloy layer during said annealing.

12. The method of claim 11, wherein said surface of said another single crystalline semiconductor-carbon alloy layer becomes a vicinal surface during said annealing.

13. The method of claim 1, wherein a graphene layer including at least one graphene monolayer is formed at said vicinal surface as semiconductor atoms evaporate from said vicinal surface during said annealing.

14. The method of claim 13, wherein said semiconductor islands comprise a same semiconductor material as a component semiconductor material of said single crystalline semiconductor-carbon alloy layer.

15. The method of claim 13, wherein said annealing is performed at a temperature that induces evaporation of said semiconductor islands from between said surface of a single crystalline semiconductor-carbon alloy layer and said substrate.

16. The method of claim 13, wherein said surface of said single crystalline semiconductor-carbon alloy layer is is at an angle between 88 degrees and 89.999 degrees with a crystallographic orientation of said single crystalline semiconductor-carbon alloy layer.

17. The method of claim 13, wherein said single crystalline semiconductor-carbon alloy layer is a single crystalline silicon carbide layer.

18. The method of claim 13, wherein said substrate includes another single crystalline semiconductor-carbon alloy layer, wherein a surface of said another single crystalline semiconductor-carbon alloy layer faces said surface of said single crystalline semiconductor-carbon alloy layer during said annealing, and another graphene layer including at least one graphene monolayer is formed at said of said another single crystalline semiconductor-carbon alloy layer after said annealing.

* * * * *